(12) United States Patent
Ozawa et al.

(10) Patent No.: US 6,297,827 B1
(45) Date of Patent: Oct. 2, 2001

(54) WAVE-FORM OBSERVATION APPARATUS

(75) Inventors: Satoshi Ozawa; Kikutada Yoshida, both of Tokyo (JP)

(73) Assignee: Iwatsu Electric Co., Ltd., Tokyo (JP)

( * ) Notice: Subject to any disclaimer, the term of this patent is extended or adjusted under 35 U.S.C. 154(b) by 0 days.

(21) Appl. No.: 09/235,316

(22) Filed: Jan. 22, 1999

(30) Foreign Application Priority Data

Feb. 23, 1998 (JP) .................................. 10-057467

(51) Int. Cl.⁷ .................................................... G09G 5/36
(52) U.S. Cl. ........................................ 345/440.1; 345/440
(58) Field of Search .............................. 345/440, 440.1, 345/441, 442, 443; 324/121 R

(56) References Cited

U.S. PATENT DOCUMENTS 4,426,644 * 1/1984 Neumann et al. ................ 345/440.1
4,743,845 * 5/1988 Diller et al. ........................ 423/121

* cited by examiner

*Primary Examiner*—Matthew Luu
(74) *Attorney, Agent, or Firm*—Oblon, Spivak, McClelland, Maier & Neustadt, P.C.

(57) ABSTRACT

A wave-form observation apparatus i.e. a digital oscilloscope configured to store and display wave-forms being displayed by a simple operation is disclosed. The analog input picture signal 1 includes wave-forms, characters and figures with their intensity information. The analog signal 1 is A/D converted to a picture data 2. A subtracted picture data 3 is obtained by subtracting a predetermined value from an intensity of the stored picture data 7. Two intensities of the data 2 and 3 are compared. In a ready state for the memory operation, the predetermined value is set to zero, By pushing a button 16, the picture data 2 having strong intensity is selected in the switch S2 to obtain intense picture data 6. Thereafter the switch S2 selects the data 3 which is equal to the intense picture data 6 in their intensities. Thus the stored picture data 7 is repeatedly displayed in the memory operation.

4 Claims, 4 Drawing Sheets

WAVE-FORM OBSERVATION APPARATUS

BACKGROUND OF THE INVENTION

1. Field of the Invention

The present invention relates to a wave-form observation apparatus.

The invention is particularly concerned with an apparatus for displaying and observing an input picture signal and/or a stored input picture signal simultaneously or individually. The input picture signal includes wave-forms, characters and/or figures with their intensity (i.e. brightness) information for display.

2. Description of the Prior Art

Shown in FIG. 1 is a circuit diagram of a prior art wave-form observation apparatus employed in osciloscopes.

In FIG. 1, there is an input picture signal 1. This is an analog signal including wave-forms, characters and figures with their intensity (i.e. brightness) informations for display. The analog input picture signal 1 is applied to an A/D converter 10, The A/D converter converts the analog input signal 1 to a picture data 2.

A comparator 11 receives the picture data 2 and a subtracted picture data 3 delivered from a subtracter 13. The comparator 11 compares two intensity (i.e. brightness) data included in broth data 2 and 3. When the intensity of the data 2 is stronger than another, the comparator 11 delivers a compared result 4. The compared result 4 is applied to a switch S2. The picture data 2 connected with a terminal "a" of a switch S2 is applied to a memory 12 as a intense picture data 6. The data 6 is stored therein. In this case, the data 6 is the same data as the data 2.

The memory 12 delivers a stored picture data 7 including intensity data to the subtracter 13. Therein, a predetermined subtractive value is subtracted from the intensity data, Thereby, an intensity of the stored picture data 7 decreases. A subtracted picture data 3 including decreased intensity data is obtained from the subtracter 13. The data 3 is connected with the comparator 11 and a terminal "b" of the switch S2.

When the intensity of the subtracted picture data 3 is not smaller than that of data 2 in the input of the comparator 11, the data 3 connected with the terminal "b" of the switch S2 is applied to the memory 12 as a bright picture data 6. The above-mentioned operation is repeated.

A display composer 17 composes the picture data 2 and the
subtracted picture data 3 to apply the composed data to a display 18. Input wave-forms included in the data 2 and/or stored wave-forms included in the data 3 are simultaneously or individually displayed on the display 18 at timing of a display timing signal 8 delivered from a display timing generator 14.

There are shown in FIG. 2 time charts of the intense picture data 6(a) and the display timing signal 8(b).

A display cycle T is a time interval between a timing t1 and t2 or t2 and t3. A picture is displayed on the display 18 and stored in the memory 12 at a display cycle T.

The picture data 2 and the subtracted picture data 3, which is delivered from the intense picture data 6 via the memory 12 and the subtracter 13, are composed by the display composer 17 and displayed on the display 18 every display cycle T.

When the predetermined subtractive value of the subtracter 13 is large, a picture (e.g. wave-forms) with afterglow (i.e. persistent in eyesight) for a short time period is observable on the display 18. When the predetermined subtractive value is small, a picture (e.g. wave-forms) with the afterglow (i.e. persistent in eyesight) for a long time period is observable on the display 18. When the predetermined subtractive value is zero, the afterglow (i.e. persistent bright) for an infinity time period is obtainable because the stored picture data 7 is repeatedly displayed. This is an infinity afterglow operation.

When the predetermined subtractive value is large enough or a writing operation to write the intense picture data 6 into the memory 12 is inhibited wave-forms included in the input picture signal 1 are displayed, on the display 18. This is a non afterglow operation.

When the infinity afterglow operation and the non afterglow operation are alternately repeated, the current wave-forms included in the picture data 2 and the stored past wave-forms included in the subtracted picture data 3 are displayed simultaneously in human eyesight. In case of watching changes of wave-forms in various measurement conditions, the current wave-forms and the stored past wave-forms are simultaneously displayed.

In a multichannel wave-form observation apparatus, the memory 12 has storage segments. Each storage segment is for each channel. In such a case, current wave-forms and past wave-forms of multichannels are simultaneously displayable for comparison observation. In order to display past wave-forms, the infinity afterglow operation and a freezing operation to inhibit the memory 12 from rewriting are required. Those operations are complicated.

SUMMARY OF THE INVENTION

An object of the present invention is to provide a novel wave-form observation apparatus for storing current wave-forms by means of a single operation pushing a button without complicated operations such as an infinity afterglow operation and a freezing operation According to an aspect of the present invention a memory is rewritable only for a single cycle time of a gate immediately after pushing a button in a memory operation. Therein, a subtractive value is zero for a ready state for the memory operation before pushing the button, so stored data are unrewritable in the memory. A gate is generated for a period of a display timing signal immediately after pushing the button. Then the memory stores a intense picture data. Stronger intense picture data than another is selected among a current picture data and a subtracted picture data in which include wave-form data, characters, intensity data and so on. So the wave-forms, and characters of the selected picture data are display ed on the display.

BRIEF DESCRIPTION OF THE DRAWINGS

The principle construction and operation of the present invention will be clearly understood from following detailed description taken in conjunction with the accompanying drawings, in which.

DESCRIPTION OF THE PREFERRED EMBODIMENTS

The present invention will be described herein under detail with reference to the accompanying drawings.

Figure 1:
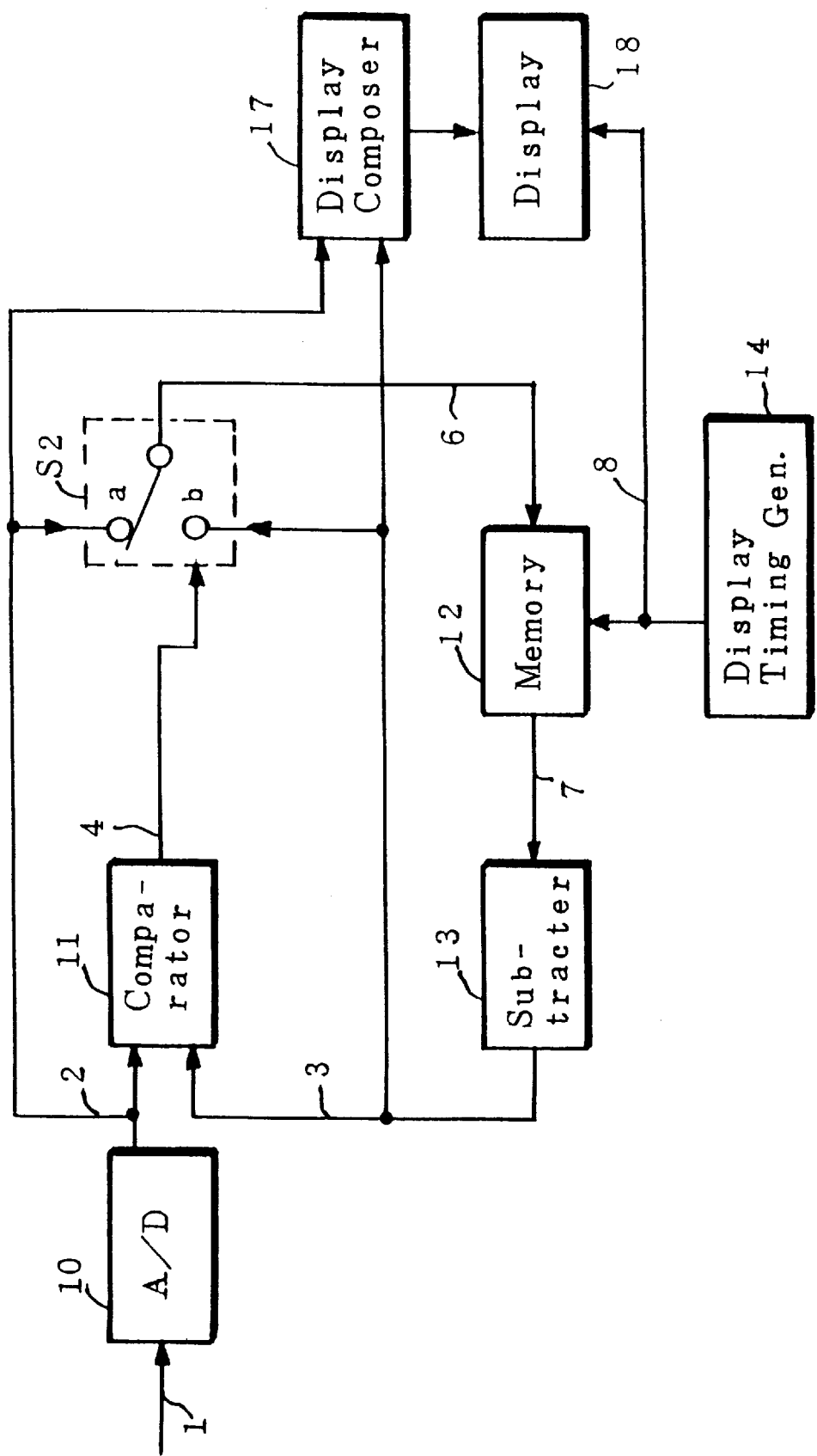
FIG. 1 is a block diagram of a wave-form observation apparatus in accordance with the prior art.
Figure 3:
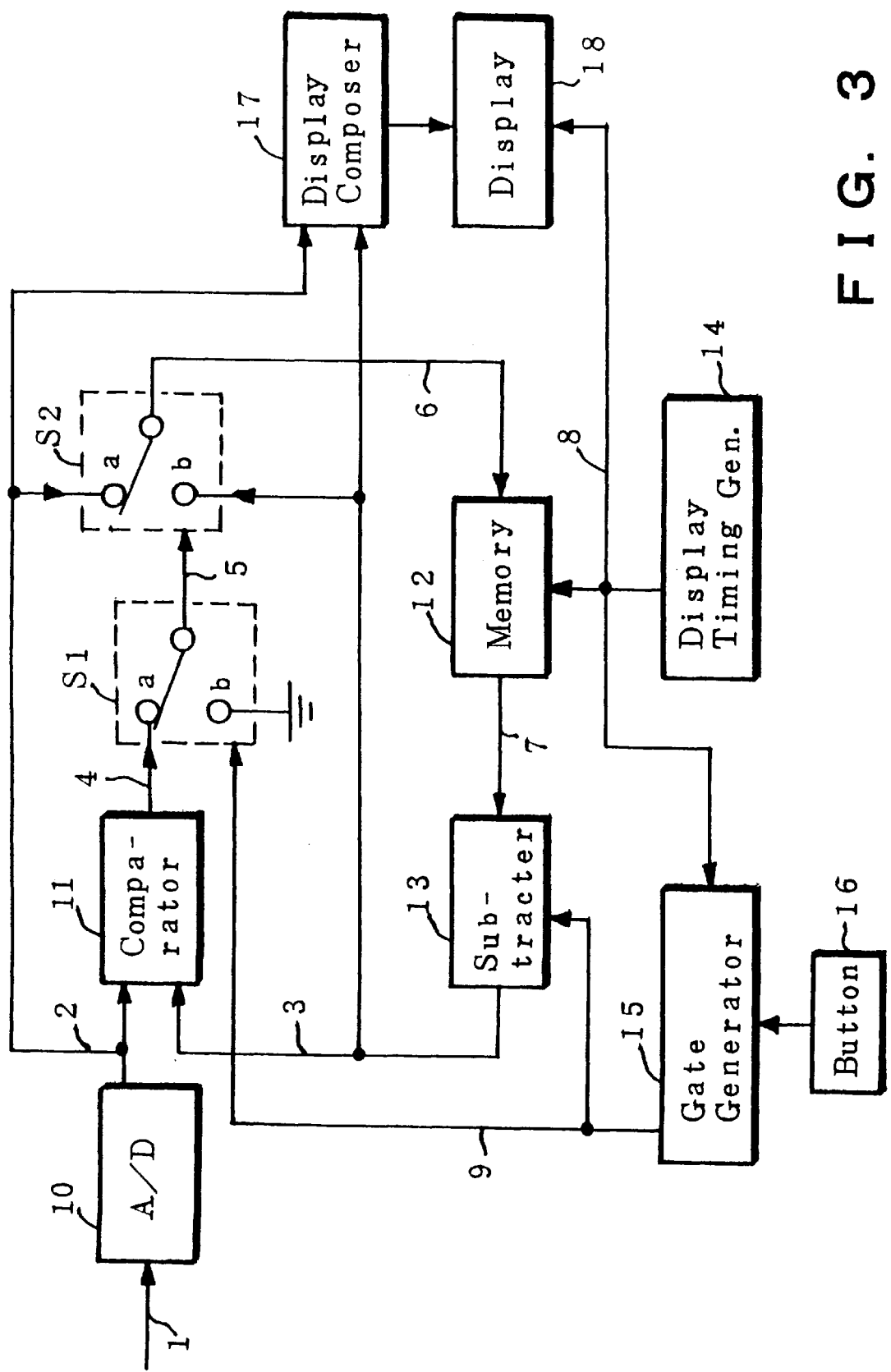
FIG. 3 is a block diagram of a wave-form observation apparatus in accordance with the present invention.

FIG. 3 shows an embodiment of the present invention constructed as a wave-form observation apparatus. Here, the reference numerals in FIG. 3 are the same as those of FIG. 1.

At first an afterglow (i.e. persistent bright in human eyesight) operation will be described. This is the same operation as that of FIG. 1.

In FIG. 3, there is an input picture signal 1. This is an analog signal including wave-forms, characters and figures with their intensity informations. The analog input picture signal 1 is applied to an A/D converter 10. The A/D converter 10 converts the analog input picture signal 1 to a digital picture data 2.

A comparator 11 receives the picture data 2 and a subtracted picture data 3 delivered from a subtracter 13. The comparator 11 compares two intensity data included in both data 2 and 3. When the intensity of the data 2 is stronger than another, the comparator 11 delivers a compared result 4 to a terminal "a" of a switch S1. A terminal "b" of the switch S1 is grounded. The switch S1 is controlled by a gate 9 delivered from a gate generator 15.

In the afterglow operation, the terminal "a" of the switch S1 is always selected, so that the switch S1 delivers the compared result 4 as a selection signal 5 to a switch S2. When an intensity of the picture data is stronger than that of the subtracted picture data 3, the terminal "a" connected with the date, 2 is selected in the switch S2 by the selection signal 5. The switch 2 delivers the intense picture data 6 which is the same data as the data 2. Thus, the memory 12 stores the intense picture data 6.

The memory 12 delivers a stored picture data 7 including an intensity data to a subtracter 13.

The subtracter 13 subtracts a predetermined subtractive value from the intensity data of the data 7 to obtain the subtracted picture data 3. By means of the subtractive operation, the intensity of the data 3 is weakened from that of the data 7. The data 3 is connected with the comparator 31 and the terminal "b" of the switch 2.

Figure 2:
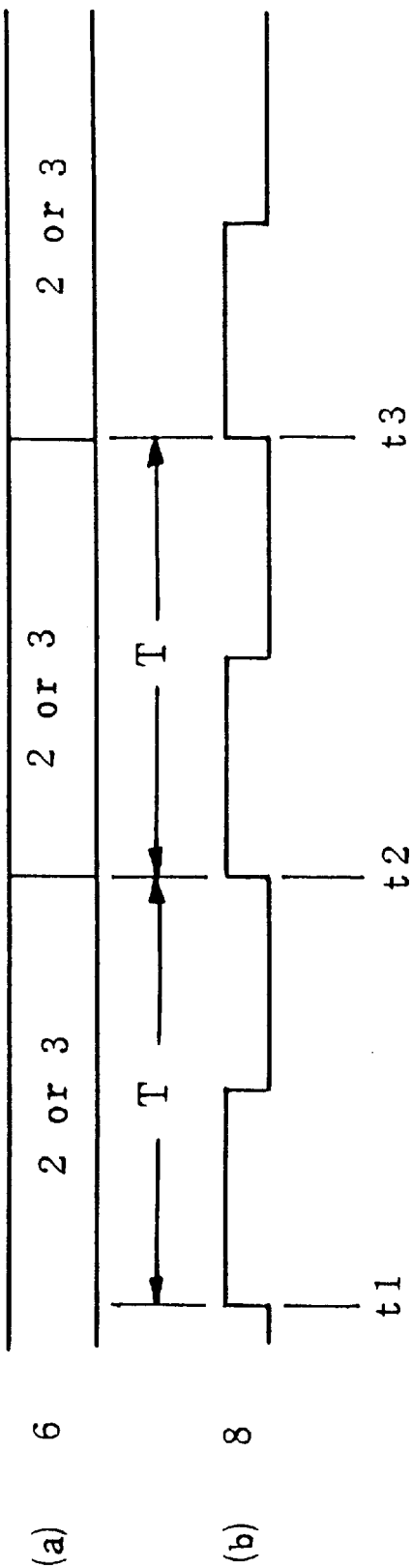
FIG. 2 is a time chart showing an operation in accordance with the prior art.
Figure 4:
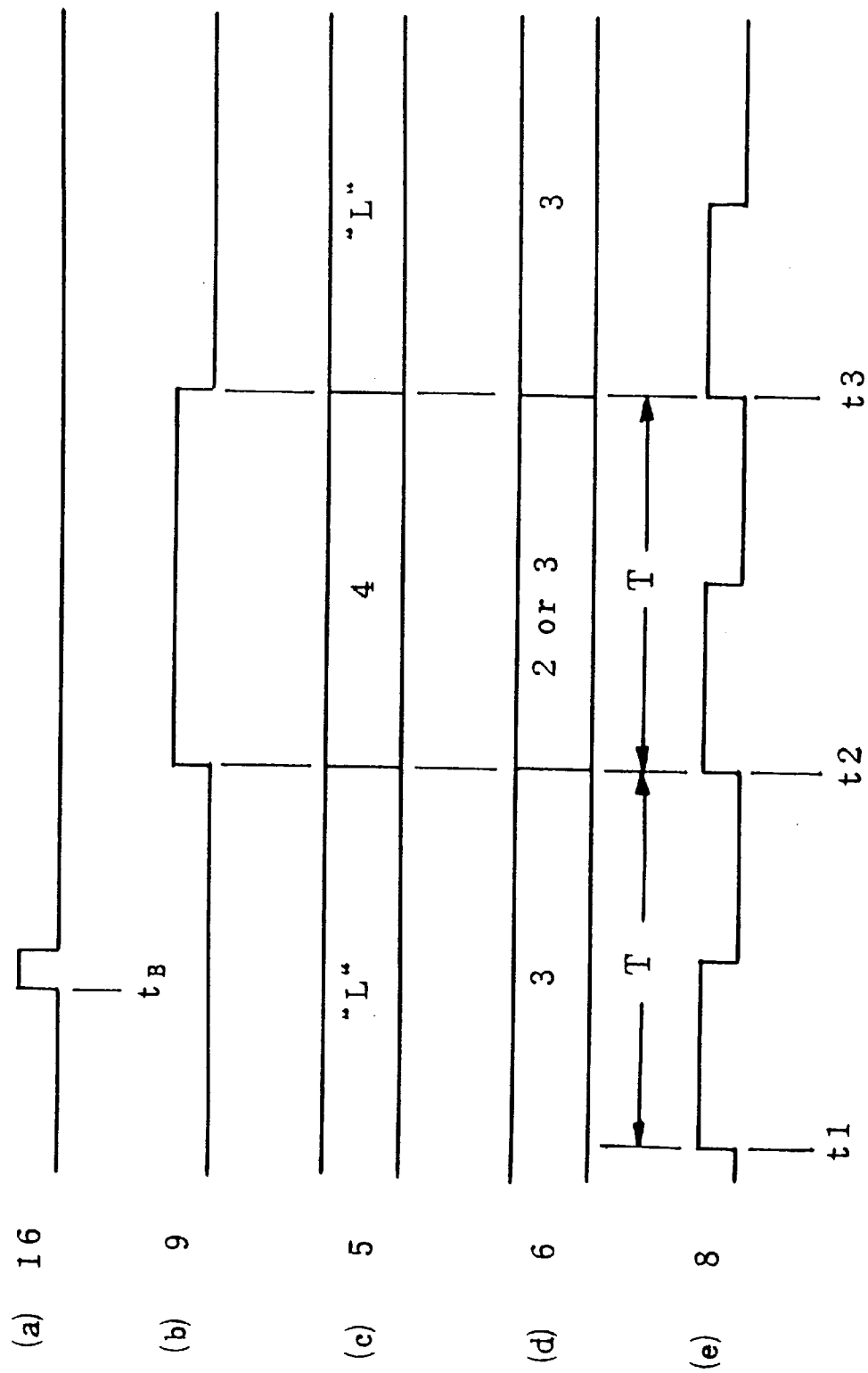
FIG. 4 is a time chart showing an operation in accordance with the present invention.

There a re shown in FIG. 4 time charts of various points of FIG. 3. FIG. 4 corresponds to FIG. 2.

A display cycle T is a time interval between a timing t1 and t2 or t2 and t3. A picture is displayed on the display 18 and stored into the memory 12 during a display cycle T.

The display composer 17 composes the picture data 2 and the subtracted picture data 3, which is delivered from the intense picture data 6 via the memory 12 and the subtracter 13. The composed pictures are displayed on the display 18 every display cycle T.

When the predetermined subtractive value is zero for example, the subtracter 13 subtracts zero from the intensity data included in the stored picture data 7 to obtain the subtracted picture data 3. It is therefore the same data as the data 7. In both data 3 and 7, their intensities are the same value.

The comparator 11 comparates two intensities of the current picture data 2 and the subtracted picture data 3. The intensity of the data 2 is not stronger than that of the data 3. Then the comparator 11 delivers the compared result 4 to the switch S2 as the selection signal 5 via switch S1. The switch S2 switches to its terminal "b" at the timing t1. Thus the intense picture data 6 is the same as the subtracted picture data 3.

When the predetermined subtractive value of the subtracter 13 is large, afterglow (i.e. persistent bright) for a short time period is observable on the display 18.

When the predetermined subtractive value is small, the afterglow for a long time period is observable on the display 18.

When the predetermined subtractive value is zero, the afterglow for an infinity time period is obtainable because the stored picture data 7 is repeatedly displayed. This is a infinity afterglow operation, which is the same operation as the prior art operation shown in FIGS. 1 and 2. In the afterglow operation or the infinity afterglow operation the gate generator 15 does not operate. The gate 9 is "H".

A display timing generator 14 generates the timing signal 8 to deliver to the memory 12, the gate generator 15 and the display 18.

In the ready state for memory operation after the above-mentioned afterglow operation, the gate generator 15 does not operate until the button 16 is pushed once. The memory operation is started by pushing the button 16 at a timing $t_B$ of FIG. 4(a).

The memory operation is to store the picture data which includes wave-forms being displayed on the display 18.

In FIG. 4, until the button 16 is pushed in the ready state for memory operation, a gate 9 of (b) is "L" (i.e. in low level), a selection signal 5 of (c) is "L" and an intense picture data 6 of (d) indicates a subtracted picture data 3. The switch S1 selects its terminal "b" so as to obtain "L" of the selection signal 5.

The gate 9 is "H" in the afterglow operation and "L" in the ready state for memory operation. In the afterglow operation, the switch S2 selects a terminal "a" is connected with the picture data 2 and the terminal "b" is connected with the subtracted picture data 3. Therein, the switch S2 selects a stronger intense picture data than another between data 2 and 3. In the ready state for the memory operation, the switch S2 selects the terminal "b".

The display timing generator 14 generates always display timing signal 8 of the display cycle T in FIG. 4.(e).

At the start of the ready state for the memory operation (i.e. the ready state is prior to timing $t_B$ of FIG. 4), the gate 9 turns to "L" from "H". Thereby, the predetermined subtractive value is reset to zero in the subtracter 13, and the intense picture data 6 becomes the subtracted data 3.

The button 16 is pushed at the timing $T_B$ between the timing t1 and t2 of rising edges of the display timing signal 8 of FIG. 4(e). At the timing t2 of the rising edge of the signal 8 immediately after the timing $t_B$, the gate 9 of (b) turns to "H" and the "H" state continues for only one display cycle time T.

Between the timings t1 and t2, the switch S1 select its terminal "a" so that the selection signal 5 equals to the compared result 4. Therefore the intense picture data 6 equals to a data including stronger intensity data than another between the picture data 2 and the subtracted picture data 3. The memory 12 stores the intense picture data 6.

After the timing t3, it returns to the ready state for the memory operation. The ready state is again turnable to the memory operation by pushing the button 16. It is returnable to the afterglow operation from the ready state by the gate generator 15 unoperated.

As has been described herein before, according to the present invention, the memory operation by pushing the button single time is executable.

What is claimed is:

1. A wave-form observation apparatus comprising:

A/D converting means (10) for converting an analog input picture signal (1) including at least a wave-form with its intensity information to be observed to digital data to obtain picture data with its intensity data (2);

storing and subtracting means (12, 13) for storing intense picture data with its intensity data (6) to obtain stored picture data with its intensity data (7) and subtracting a predetermined subtractive value from the intensity data of the stored picture data (7) to obtain subtracted picture data with its intensity data (3), wherein a memory operation is executable to store data of at least a wave-form being displayed by setting the predetermined subtractive value to zero for displaying;

comparing means (11) for comparing the intensity data of the picture data (2) and the subtracted picture data (3) to obtain a compared result (4) for selecting a stronger intensity data than another;

composing and displaying means (17, 18, 14) for composing and displaying wave-forms included in the picture data (2) and the subtracted picture data (3) every display timing (8), wherein an afterglow operation is executable to display at least a wave-form with afterglow determined by the predetermined subtractive value;

selecting means (S1, S2, 15) for selecting the compared result (4) as a selection signal (5) to select data as at intense picture data (6) which selected data has a stronger intensity than another between the picture data (3) in the afterglow operation, or, to select the subtracted picture data (3) as the intense picture data (6) and to select the subtractive data (3) as an intense picture data (6) during a cycle of the display timing (8) operation by an instruction (16) to store, wherein said selecting means (S1, S2, S15) comprises a first selecting means (S1) for selecting the compared result (4) as the selection signal (5) in the afterglow operation, a second selecting means (S2) for selecting a data as an intense picture data (6) which selected data has a stronger intensity than another between the picture data (2) and the subtractive picture data (3).

2. A wave-form observation apparatus according to claim 1, wherein said selecting means (S1, S2, S15) comprises gate generating means (15) for generating a gate (9) during a cycle of the display timing (8) in the memory operation.

3. A wave-form observation apparatus according to claim 1, wherein said storing and subtracting means (12, 13) comprise storing means (12) for storing the intense picture data (6) to deliver stored picture (7), and subtracting means (13) for subtracting the predetermined subtractive value from an intensity data of the stored picture (7) to deliver the subtracted picture data (3) in the afterglow operation, and for subtracting zero from the intense data of the stored picture (7) to deliver the subtracted picture data (3) in the memory operation.

4. A wave-form observation apparatus according to claim 2, wherein;

said first selecting means (S1) comprises means for selecting a zero signal as the selection signal (5) unless the gate (9) and the compared result (4) as the selection signal (5) during a cycle of the gate (9) in the memory operation, and said second selecting means (S2) comprises means for selecting the subtracted picture data (3) as an intense picture data (6) when the selection signal (5) is a zero signal.

* * * * *